United States Patent [19]

Hallman

[11] 4,379,827

[45] * Apr. 12, 1983

[54] IMAGING STRUCTURE WITH TELLURIUM METAL FILM AND ENERGY SENSITIVE MATERIAL THEREON

[75] Inventor: Robert W. Hallman, Orchard Lake, Mich.

[73] Assignee: Energy Conversion Devices, Inc., Troy, Mich.

[*] Notice: The portion of the term of this patent subsequent to Sep. 12, 1996, has been disclaimed.

[21] Appl. No.: 350,372

[22] Filed: Apr. 12, 1973

Related U.S. Application Data

[63] Continuation-in-part of Ser. No. 205,860, Dec. 8, 1971, abandoned.

[51] Int. Cl.$^3$ .................. G03C 1/54; G03C 1/72; G03C 1/94
[52] U.S. Cl. ........................................ 430/166; 430/8; 430/157; 430/158; 430/271; 430/275; 430/276; 430/299; 430/325; 430/326; 430/331
[58] Field of Search ............... 96/75, 91 D, 91 R, 67, 96/88; 430/158, 166, 271, 275, 8, 276, 299, 325, 326, 331

[56] References Cited

U.S. PATENT DOCUMENTS

| | | | |
|---|---|---|---|
| 2,914,404 | 11/1959 | Fanselau | 96/75 |
| 3,201,239 | 8/1965 | Neugebauer et al. | 96/91 D |
| 3,288,608 | 11/1966 | Coutaud et al. | 96/91 D |
| 3,532,055 | 10/1970 | Wheeler | 96/91 D |
| 3,551,154 | 12/1970 | DiBlas et al. | 96/91 D |
| 3,639,185 | 2/1972 | Colom | 96/75 |
| 3,759,711 | 9/1973 | Rauner | 96/91 D |

*Primary Examiner*—Charles L. Bowers, Jr.
*Attorney, Agent, or Firm*—Lawrence G. Norris

[57] ABSTRACT

A structure, and method, for producing images such as microform, particularly, microfilm. The structure in its preferred form comprises a flexible substrate having a film, layer or coating of a metal, or metal-like, image forming material on at least one surface thereof. The image forming material, in turn, is provided with a film, layer or coating of an energy sensitive material. The structure is characterized in that it can be exposed to actinic radiation, for example, and developed in a fraction of a second to provide a dry microform having high acuity, contrast and resolution, excellent archival properties, and, significantly, in the case of positive working energy sensitive materials, unique add-on capabilities. The structure and method also have utility in the graphic arts field.

3 Claims, 9 Drawing Figures

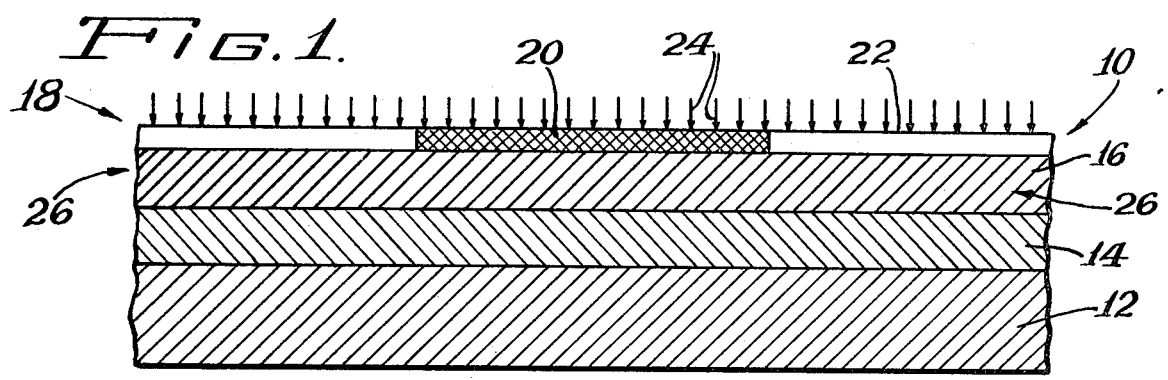
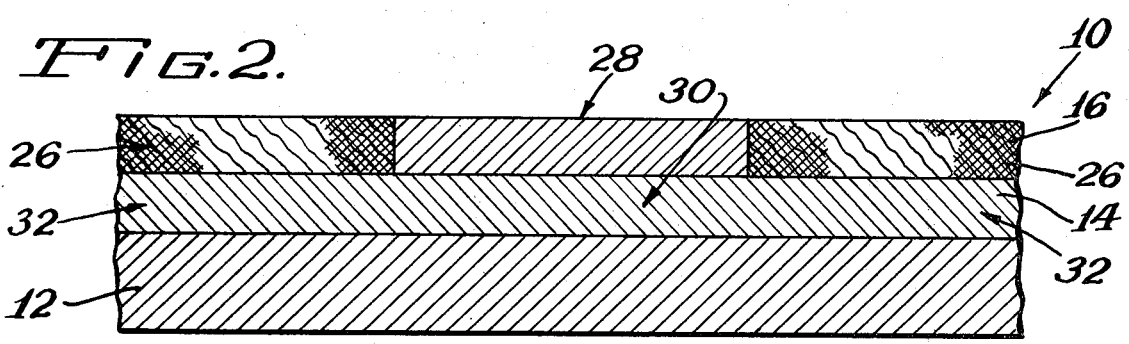
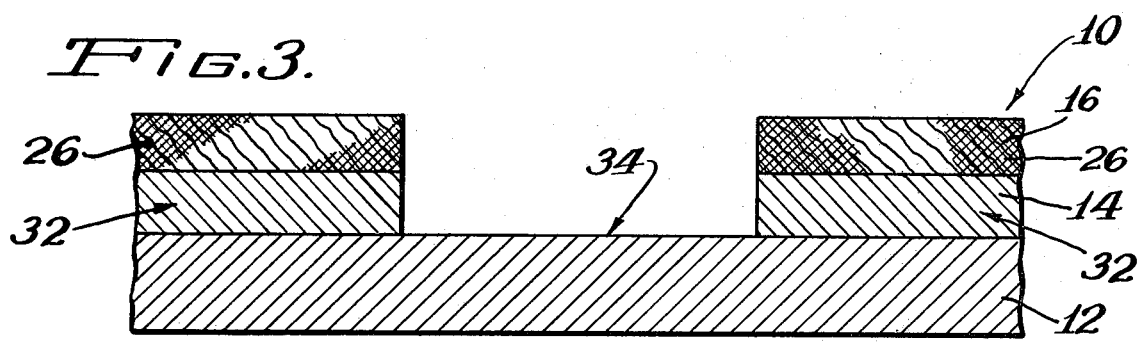
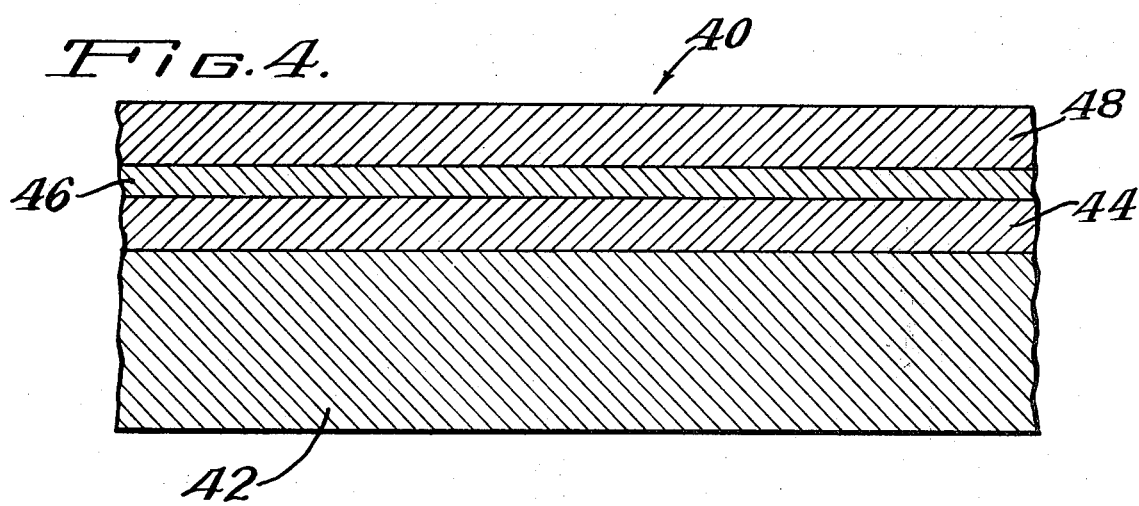

IMAGING STRUCTURE WITH TELLURIUM METAL FILM AND ENERGY SENSITIVE MATERIAL THEREON

The present application is a continuation-in-part of copending patent application Ser. No. 205,860, filed Dec. 8, 1971, now abandoned.

The present invention relates to an imaging structure, and method, for producing images, especially microform images, microfilm in particular.

Microform, such as microfilm, heretofore has been produced, in the main, by one of three processes, namely, the diazo process, the silver halide process, and the vesicular process. All of these processes share one, or more, disadvantages, chief among which are relatively long development times, and the number of steps, and the type of materials and equipment, required to produce a finished product. The products obtained by these processes among other things, generally lack archival quality, are low gamma systems having resolution and contrast limitations, and manifest poor multiple generation capabilities.

Perhaps the most widely used of the three processes is the diazo process. This process is based on the formation of a dye as a result of the reaction of a diazo compound with its decomposition product or with a coupling component. While basically a low cost process, the diazo process has a number of important disadvantages, including the necessity, generally, for utilizing aqueous or gaseous ammonia as the developer for the exposed sheet material. Apart from its obnoxious properties, the use of aqueous or gaseous ammonia in the process requires special equipment to insure uniform distribution of ammonia vapor in the developing chamber, and to prevent the accumulation of any condensed ammonia vapors therein. Precautions, also, must be taken to prevent escape of ammonia vapors in the work area. Even then ammonia vapors are invariably sensed in the work area. Over and above the foregoing considerations, the process requires expensive machinery with long path lengths to carry out development of the exposed sheet material, and, in addition, requires development times of the order of at least tens of seconds. Apart from these shortcomings, images produced by the diazo process have low contrast, a severe limitation especially in microfilm where, due to the requirement for considerable enlargement in readout, the highest possible contrast is needed. Furthermore, images produced by the diazo process tend to fade, and, therefore, are not permanent. In addition, the developed sheet material has no add-on capabilities, that is, development after exposure destroys the sensitivity of the diazo compound thereby preventing further exposure and development of initially unexposed areas of the sheet material.

The silver halide process ranks behind the diazo process in extent of use in the production of microform such as microfilm. The silver halide process is a multiple step process, and, like the diazo process, requires of the order of at least tens of seconds to carry out development of the exposed sheet material. The process employs short-lived developing chemicals, which are unpredictable, and which due to surface phenomena, are absorbed and adsorb on the surface of the substrate to an extent such that drying of the developed sheet material is difficult. The nature of the process, therefore, requires a skilled operator to carry it out. The images obtained by the process usually are of low contrast and have poor edge acuity due to the granular character of the silver halide emulsions. Furthermore, the images must be processed with special chemicals to impart archival properties to the finished product. Also, as in the case of the end product obtained by the diazo process, the silver halide process has a further important disadvantage in that the silver halide is desensitized during development and, therefore, has no add-on capabilities. Over and above the foregoing considerations, the silver halide process is dependent upon the use of silver containing compounds. Silver is already in short supply, and reserves of the metal are being depleted at an alarming rate.

The vesicular process, also, is a multiple step process. Thus, for example, the vesicular film is first given an overall pre-exposure sensitization. This is followed by an image-wise exposure, heating, and, finally, a post-exposure fix. Development of the exposed sheet material requires temperatures in the range of 120° C. to 140° C. to bring about expansion of nitrogen gas release by a diazo component during exposure of the sheet material. Due to the relatively high development temperatures employed, vesicular films require the use of more costly, heat stable substrates. Heat also acts to erase the image and, therefore, suitable precautions must be taken to protect the developed film from heat during storage and use, a factor which detracts from the archival qualities of the film. The vesicular process has the added disadvantage of very poor latent image stability which requires immediate development after exposure. Images obtained by the process have inferior edge acuity, limited resolution, and relatively low contrast, and a contrast which is dependent upon the aperture system used. In addition, development of the exposed film in the vesicular process results in desensitization of the nitrogen gas releasing diazo component, thereby destroying, as in the case of the diazo and silver halide processes, any add-on possibilities in the finished product.

While the diazo, the silver halide and the vesicular processes account for most of the microfilm presently produced, one recently developed process, namely, the dry silver process, is deserving of comment. Briefly, the dry silver process is characterized in that it requires short exposure times, and the exposed film can be developed rapidly by the application of heat. The film produced by this process, however, like the films obtained from the aforedescribed processes, has resolution and contrast limitations which usually produce relatively poor quality readable copy when the microfilmed images are enlarged to full size. In addition, this process requires the use of heat to develop the film, and like the silver halide process, is dependent upon the use of a costly material such as silver.

In accordance with the present invention, a structure for producing images, microform in particular, as exemplified by microfilm, has been evolved which is uniquely different from prior imaging materials employed for producing microform not only from the standpoint of the end product obtainable from it, but, also, from the standpoint of its ability to be processed, after exposure, essentially instantaneously in a single step, in a single, or common, solvent system, to provide ready-to-use microform. Microform produced from the structure of this invention is characterized by having a higher contrast than is now obtainable with conventional materials. It is further characterized by having outstanding edge acutance and resolution which, in certain instances, enables an increase in sharpness and resolution to be attained exceeding even that of the original. In addition, microform produced from the structure, without post-development processing of any kind, has archival properties which are superior to those of microform produced from conventional materials. Further, in this latter connection, microform produced from the structure of the present invention is not adversely affected by either extreme changes in temperature or humidity, and is resistant to fungal and bacterial attack. The structure of the present invention is further characterized in that it can be exposed and developed in a fraction of the time required for other films without the need for skilled operators. This characteristic of the structure, coupled with its ability to be processed, after exposure, in a single, or common, solvent system, in essentially a single step, makes the structure especially adaptable for high-speed, continuous, mass production of microform with simple, inexpensive equipment. The finished product, apart from the outstanding characteristics noted above, has multiple generation capabilities unmatched by films produced by prior processes. More specifically in this connection, up to ten generations have been produced with films of this invention without any noticeable image degradation. This is in sharp contrast to films produced by the silver halide process where upwards of a 20% loss in resolution and contrast per generation is experienced, or, in the case of films produced by the diazo and vesicular processes, were upwards of a 10% loss in resolution and contrast per generation is observed.

A further, highly important advantage of the structure of this invention is its add-on capabilities, a property which, as indicated above, is not present in films produced by prior processes. In the positive working embodiments of the structure, as disclosed in detail hereinafter, the unexposed areas remain hydrophobic until exposed. As a result, such unexposed areas are not wetted during development and, therefore, retain their sensitivity so long as they are protected against subsequent exposure. These unexposed areas, thus, are capable of receiving additional images. This property of the structure of the present invention also enables selective editing, or erasure, of existing images through exposure of these same unexposed areas of the developed film.

A still further, highly significant advantage of the structure of this invention over films produced by prior processes is that the structure enables the production of a film having images on both sides thereof. Films produced by the prior processes discussed above obtain density by way of an additive process through either dye coupling, silver growth by way of oxidation-reduction chemistry, or through vesicles created by heating and bubble formation of gaseous photosensitive products. The structure of this invention achieves density at the manufacturing stage and enables the production of dense images by way of a substractive process. This unique property of the structure permits imaging material to be placed on both sides of the structure, and effectively masks imagewise exposure of one side thereby preventing exposure energy from affecting the opposite side. Films produced by prior processes would produce a show-through exposure and would, therefore, be incapable of permitting use of both sides of the film. The ability of the structure of the present invention to enable images to be placed on both sides effectively doubles the volume packing density of the structure. It is noteworthy that this increase in packing density is produced without imposing any restraints on the exposure energy involved in the production of the finished product. With the use of suitable readout equipment, both sides of the finished product can be read without the need for turning the film over. The result is more rapid retrieval of more densely packed images.

The structure of the present invention, in brief, comprises at least one continuous film or layer of an energy sensitive material characterized in part in that it is capable of being changed upon exposure to energy between two states, one of which is a state in which it is easily or readily soluble, or permeable, with respect to a given solvent, and another being a state wherein it is substantially insoluble, or soluble or permeable to a lesser extent, with respect to the same solvent. The structure further comprises at least one continuous film or layer of an image forming material characterized in part in that it is soluble in the same solvent with respect to which the energy sensitive material is soluble, or permeable, when the latter is in a state of easy or ready solubility or permeability with respect to said solvent. The energy sensitive material and the image forming material advantageously are carried on a substrate to provide a structure wherein the film or layer of the image forming material is in direct contact with the substrate, and the film or layer of the energy sensitive material overlies the image forming material. The films or layers comprising the energy sensitive material and the image-forming material may be made up entirely of the respective materials, or, as described hereinafter, may contain other substances such as binders, fillers, or the like, in admixture therewith. In addition, intermediate films or layers of other materials may be located between the film or layer of the energy sensitive material and the film or layer of the image forming material, and/or between the substrate and the film or layer of the image forming material.

In accordance with the method aspects of the invention, a structure as described above is subjected imagewise to energy to bring about a change in selected areas of the energy sensitive layer in a manner such that a latent image is formed therein comprised of areas of energy sensitive material which are soluble, or permeable, with respect to a given solvent and other areas of energy sensitive material which are substantially insoluble, or soluble or permeable to a lesser extent, with respect to the same solvent. The structure thereafter advantageously is treated with a single, or common solvent, that is, a solvent which acts substantially instantaneously to dissolve, or permeate, the solvent soluble, or permeable, areas of the energy sensitive material and to dissolve the image forming material underlying the solvent soluble, or permeable, areas of the energy sensitive material. In this manner, an image is formed which consists of the image forming material overlayed by the energy sensitive material in the areas where the latter is in a state of being substantially insoluble, or soluble or permeable to a lesser extent, and no image forming material and no energy sensitive material in the areas where the latter material is in a state of being readily or easily soluble, or permeable. In those instances where the energy sensitive material is permeated by a given solvent, the energy sensitive material, being transparent, can remain on the developed film without adversely affecting the quality of the film. It is important to note in this connection that the results attained with the structure of this invention is not dependent upon the conversion with actinic radiation, for example, of the energy sensitive film or layer to an opaque state as in the case of prior light sensitive microfilm materials. In sharp contrast to such prior art films, opacity in the structure of the present invention is determined by the opacity of the image forming film or layer. The amount of energy, therefore, needed to form an image on the structure is merely that necessary to form a latent image in the energy sensitive film or layer which, as stated, after exposure comprises areas of different solubility or permeability with respect to a given solvent. Thus, the reduction in the amount of light energy necessary to produce an image on the structure of this invention relative to that required with prior light responsive duplicating microfilm materials is of an order of magnitude of 10 or greater.

As indicated, development of the exposed structure can be carried out in essentially a single step practically instantaneously. More specifically in this latter connection, development and processing to obtain a finished, ready-to-use microform can be achieved in a time period of less than ten seconds, more usually of the order of one half second, or less. If desired, the portions of the substantially insoluble, or lesser soluble, or permeable, energy sensitive material remaining on the image forming material may be later removed, for example, by the use of a different solvent. However, as stated, generally there is no need to remove the substantially insoluble, or less permeable, portions of the energy sensitive material, because they do not interfere with the read-out utilization of the image.

The term "insoluble" as used herein is intended to mean that the energy sensitive material is either essentially insoluble, or less soluble or less permeable, with respect to a given solvent than if it is in the state where it is readily soluble or permeable. The terms, accordingly, denote a relationship of solubility, or permeability, meaning that the material may not be dissolved, or be permeated, or if it is, it is dissolved, or is permeated, at a slower rate than if it is in a readily soluble or permeable state, where it is dissolved, or is permeated, at a higher rate.

Other objects, advantages and features of the invention will become apparent to those skilled in the art from the following description and claims of the invention and from the attached drawings in which:

FIG. 1 is a schematic fragmentary cross-sectional representation of an embodiment of the structure of the invention being subjected to energy through a mask;

FIG. 2 is similar to FIG. 1, showing the mask removed and the top layer changed by the energy;

FIG. 3 is similar to FIG. 2, showing the structure after treatment with a solvent in accordance with the practice of this invention;

FIG. 4 shows another embodiment of the structure of the invention, wherein an intermediary layer is provided between the energy sensitive layer and the image forming layer;

Figure 5:
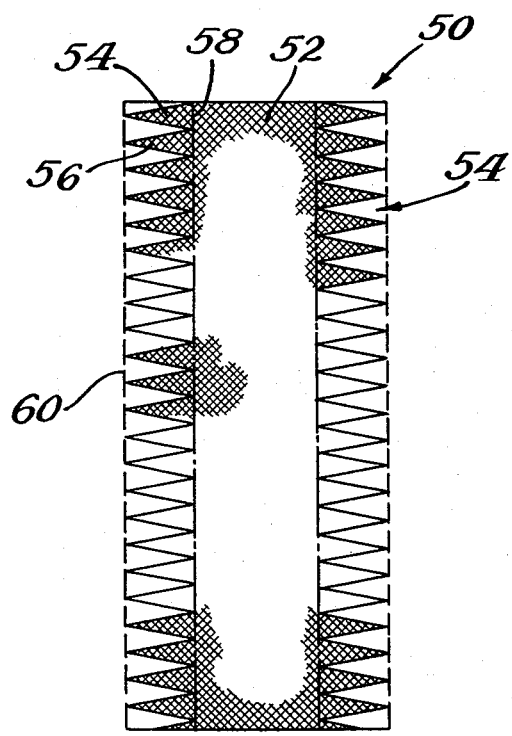
FIGS. 5 and 6 are representations, showing a character in the original (FIG. 5) having gray edge areas, and the copy thereof (FIG. 6) having a sharp separation line between black and white, on an image structure of the present invention.

Referring to the drawings, the structure 10 in FIG. 1, comprises a substrate 12. On the substrate 12 is disposed a film or layer 14 of an image forming material. On layer 14 is disposed a film or layer 16 of an energy sensitive material.

A mask 18 is shown placed on top of the structure 10. The mask comprises an opaque area 20 and light transmissive areas 22. Energy, electromagnetic radiation 24, for example, is shown falling onto the mask 18 and through light transmissive or transparent areas 22 of the mask 18 onto the layer 16. In the areas 26 underlying transparent areas 22 of the mask, the energy sensitive material 16, which was originally soluble in a given solvent, under the effect of radiation 24, becomes insoluble in said solvent. In this illustration, the material 16 is a negative working material. In area 28, which has not been exposed to radiation 24, the energy sensitive material 16 remains soluble. The structure thus altered is shown in FIG. 2, with the mask removed. When the structure shown in FIG. 2 is treated with a solvent in which the energy sensitive material and the image forming material are both soluble, the energy sensitive material in area 28 dissolves as does the image forming material in the area 30 underlying area 28. The energy sensitive material in area 26, which has become, as a result of the irradiation, water insoluble, is not dissolved. Also the image forming material in areas 32 underlying areas 26 is not dissolved. Accordingly, an image is formed by the opaque image forming material in areas 32 and the area at 34 where all of the energy sensitive material and the image forming material have been removed down to the substrate 12. Where the substrate is a clear material the area at 34 is transparent and the areas 32 comprising the image forming material are highly opaque so that an image of high contrast is formed.

The image forming materials useful in the fabrication of the structure of this invention can be selected from a wide group. Generally speaking, the image forming material utilized can be any metal, or a metal-like material, or any inorganic, organic, or metallo-organic or elemento-organic material, having image forming characteristics, which is capable, among other things, of being formed into a thin film or layer, which has a relatively high optical density at minimal thickness, and which is capable of being easily or readily dissolved in a solvent which is also capable of dissolving, or permeating, those portions of the film or layer of the energy sensitive material which have the greater solubility, or permeability, after the structure has been subjected to energy. The image forming material, further, should be compatible with the energy sensitive material and be capable of adhering to the substrate of the structure. In addition, the image forming material should not form reaction products which would inhibit its dissolution during development after exposure. Further, in accordance with the preferred embodiments of the invention, the image forming material should be hydrophobic so as not to enable a water layer to form thereon which may affect the integrity of the film or layer of the image forming material. While the foregoing desiderata are satisfied to a greater or lesser extent by various image forming materials, including metals such as molybdenum, polonium, cobalt, zinc, aluminum, copper, nickel, iron, tin, vanadium, germanium, silver and silver emulsions, they are satisfied to the greatest extent by metal-like materials such as tellurium, and tellurium containing compositions. Generally, in those instances where a tellurium containing composition is used, the tellurium should constitute at least 50% of the composition, though, sometimes materials which contain less than 50% tellurium can be employed. Suitable tellurium materials, which can be dissolved in the single, or common, solvent systems contemplated by this invention, when deposited in film form, can be found among the tellurium containing memory materials described, for instance, in U.S. Pat. No. 3,271,591 issued on Sept. 6, 1966 to S. R. Ovshinsky and U.S. Pat. No. 3,530,441 issued on Sept. 22, 1970 to S. R. Ovshinsky.

These tellurium materials include the glassy compositions which contain, besides a major proportion of tellurium, one or more other elements provided these other elements do not form a salt, or the like, with the tellurium. Typical tellurium compositions which can be used are, for example, a composition of 81 atomic parts tellurium, 15 atomic parts germanium, 2 atomic parts antimony and 2 atomic parts sulfur; a composition of 92.5 atomic parts tellurium, 2.5 atomic parts germanium, 2.5 atomic parts silicon and 2.5 atomic parts arsenic; a composition of 90 atomic parts tellurium, 5 atomic parts germanium, 3 atomic parts silicon and 2 atomic parts antimony; a composition of 85 atomic parts tellurium, 10 atomic parts germanium and 5 atomic parts bismuth; a composition of 85 atomic parts tellurium, 10 atomic parts germanium, 2.5 atomic parts indium and 2.5 atomic parts gallium; a composition of 85 atomic parts tellurium, 10 atomic parts silicon, 4 atomic parts bismuth and 1 atomic parts thallium; a composition of 80 atomic parts tellurium, 14 atomic parts germanium, 2 atomic parts bismuth, 2 atomic parts indium and 2 atomic parts sulfur; a composition of 70 atomic parts tellurium, 10 atomic parts arsenic, 10 atomic parts germanium and 10 atomic parts antimony; a composition of 60 atomic parts tellurium, 20 atomic parts germanium, 10 atomic parts selenium and 10 atomic parts sulfur; a composition of 60 atomic parts tellurium, 20 atomic parts germanium and 20 atomic parts selenium; a composition of 60 atomic parts tellurium, 20 atomic parts arsenic, 10 atomic parts germanium and 10 atomic parts gallium; a composition of 81 atomic parts tellurium, 15 atomic parts germanium, 2 atomic parts sulfur and 2 atomic parts indium; and numerous other tellurium containing compositions.

One of the significant advantages of the structure of the present invention is that only very thin films or layers of image forming material and energy sensitive material are required. This is due, in the main, as indicated above, to the fact that the useful image formed on the structure after exposure and development is not that of the film or layer of energy sensitive material, but, rather, the film or layer of image forming material. Therefore, since the image forming material need not be energy sensitive, the most important consideration, apart from the aforestated solubility characteristics, in the selection of the image forming material is that it have sufficiently high opacity to provide the high contrast which characterizes the finished products of this invention. Generally speaking, depending upon the opacity of the image forming material, the desired high contrast can be attained with film or layer thicknesses of the image forming material in the range of about 50 to about 5000 Angstroms, usually from about 1000 to about 2000 Angstroms. In those instances where tellurium, or a tellurium containing composition, comprises the image forming material film or layer, the generally optimum objectives of the invention are attained with film or layer thicknesses ranging from about 200 to about 4000 Angstroms, especially desirably from about 1000 to about 1500 Angstroms, with a thickness of about 1200 Angstroms being preferred. The economic importance of the extremely thin film or layer thicknesses employed in the structure of this invention becomes manifest when considered in relation to silver halide films, for example. Film thicknesses used on such films generally range from 5 to 10 microns. The necessity for using silver halide layers of this thickness, coupled with the depletion of silver metal reserves and the concomitant rise in the price of the metal, point up the cost advantages attainable with the structure of this invention.

The image forming material film or layer is further characterized in that it has an optical density in the aforementioned thicknesses of from about 0.5 to about 5, usually from about 2 to about 3. The image forming material may be deposited on a substrate by any of various standard practices. Thus, for example, in those instances where the image forming material comprises a metal, or a metal-like material such as tellurium or a tellurium containing composition, vapor deposition, vacuum deposition, or sputtering techniques can be employed.

Since the useful image formed on the structure after exposure and development is not that of the film or layer of the energy sensitive material, but of the film or layer of the image forming material, it is not necessary that the energy sensitive material employed in the manufacture of the structure have any opacity or visible image forming properties. From this it is clear that the energy sensitive materials having utility in the practice of the present invention can be selected from a wide group, including many energy sensitive materials which heretofore could not be used for imaging purposes because they lack sufficient differential between exposed and unexposed areas to form a visually detectable image of satisfactory contrast. The primary consideration in the selection of the energy sensitive material is its ability to undergo a change in solubility or permeability upon the application of energy. The energy may be electromagnetic radiation such as actinic radiation, electrical energy, particle energy, or mechanical energy. The energy sensitive material may be soluble in the form in which it is applied, becoming substantially insoluble, or less soluble, or impermeable, after the application of energy, with respect to a given solvent which is capable of dissolving the original material. It may also be a material, which is substantially insoluble, or difficulty so, in a given solvent, such as water, when it is applied in the form of a film or layer, and becomes, upon the application of energy, soluble, or permeable, for example, in aqueous solutions. Further in this same connection, it is possible that an energy sensitive material is soluble in an organic solvent, but insoluble in water. It may, therefore, be applied in the form of a solution in the organic solvent, which is thereafter evaporated to form a dry film or layer. After imagewise application of imaging energy, the portions of the energy sensitive material which have been subjected to the energy may become soluble, or permeable, with respect to water, or an aqueous solution, by a physical change of the material or by a chemical reaction taking place under the effects of the energy. In this case, the portions of the material which have been subjected to the energy are dissolved, or permeated, when, for example, an aqueous solvent solution is applied, while the portions of the material, having remained in the original state, are not dissolved in, or permeated by, the aqueous solvent even though the material is soluble in an organic solvent.

The energy sensitive material may be inorganic, organic, or organometallic. Generally speaking, it is advantageous to use an organic salt because of the greater choice in materials, the possibility of adapting the solubility, or permeability, characteristics thereof to the solvent requirements for a selected image forming material, and the possibility of adapting the energy sensitivity thereof to a given situation. The energy sensitive material may be negative working or positive working, the latter type materials being of particular importance in the production of films, in accordance with the practice of this invention, having add-on capabilities.

In utilizing a negative working energy sensitive material in the preparation of the structure, the generally optimum objectives of the invention are attained with certain diazo compounds, especially the high molecular weight condensation products of these nitrogen compounds. Examples thereof are the water soluble high molecular weight condensation products obtained by condensation of diazotized diphenylamine type compounds with formaldehyde or other similar condensation agents. These compounds are water soluble, or water permeable, and give off, under the effect of electromagnetic radiation, nitrogen to form a bakelite-like, substantially water insoluble, or water impermeable resinous product. These compounds comprise high molecular weight diazonium salts in which the single molecules of the diazo compound are connected by methylene bridges or similar organic bridges. Typical examples of such compounds are p-dimethylaminobenzene diazonium chloride, p-diethylaminobenzene diazonium chloride, p-diethoxyaminobenzene diazonium chloride, 1-diazo-4-chloro-2,5-diethoxybenzene, p-diazo-dimethylaniline zinc chloride, p-diazo-o-chloro-N-diethylaniline zinc chloride, 1-diazo-(4-tolyl)mercapto-2,5-diethoxybenzene zinc chloride, p-diazoethylhydroxyethylaniline zinc chloride, to name a few.

Other useful, negative working energy sensitive materials may be obtained by linking, for instance, by help of cyanuric chloride, or melamine, a diazonium substituent to a macromolecular compound, such as cellulose, casein, polyvinyl alcohol, or the like. These high molecular weight energy sensitive compounds may make up the respective top layer in the structure of the invention or they may be present in admixture with another organic colloid. Exemplary of such compounds are azido polymers of polyvinyl alcohol, specific examples of which are poly(vinyl-p-azidocinnamate), and an azidophthalate of partially hydrolyzed poly(vinyl acetate); azido polymers of cellulose such as an azidophthalate of partially hydrolyzed cellulose acetate; and azido polymers of casein and gelatin exemplified by the 3-azidophthalate of gelatin.

Other suitable negative working energy sensitive materials useful in the structures and method of the invention include the dichromated colloids of various description; and various light sensitive unsaturated compounds, such as the various stilbene compounds and methacrylic acid ester polymers which alter their solubility characteristics upon exposure to ultraviolet radiation. Exemplary of such compounds are sodium chromate and potassium chromate in gelatin, cis and trans stilbene, and polymerized methyl methacrylate.

Other negative working energy sensitive materials which can be used include the materials comprising polymerizable monomers, especially unsaturated monomers, in combination with energy activatable, and especially actinic radiation activatable catalyst systems. In the areas where actinic radiation strikes the monomer mixture, polymerization occurs spontaneously, and a polymer is formed which is insoluble. The monomeric mixture in the areas where actinic radiation has not struck remains in its monomeric soluble form and can be readily dissolved out in accordance with the method of the invention. Using as an image forming material, for instance, an opaque material, which is soluble in the same solvent as the monomer mixture, a distinct image of high contrast is instantly obtained with these materials. Specific examples of these are the reaction product of piperic acid with piperidine called piperine, and the copolymer of maleic anhydride and a hydroxy terminated arenosulfonoazide.

Also useful as negative working energy sensitive materials are various azido compounds, para-quinone diazides, in particular, exemplified by the condensation product of 2-amino-5-hydroxynaphthalene-7-sulfonic acid with naphthoquinone-(1,4)-diazide-(4)-2-sulfochloride, the condensation product of the bis-amide of benzoquinone-(1,4)-diazide-(4)-2-carboxylic acid and 4,4'-diaminodiphenyl-2,2'-disulfonic acid, and independently with 4,4'-bis-(naphthoquinone-(1",4")-diazide-(4")-2"-(sulfonyl-amino-diphenyl-2,2'-disulfonic acid, the condensation product of N,N'-bis-(5-hydroxy-7-sulfonic acid naphthyl-(2)-urea with naphthoquinone-(1,4)-diazide-(4)-2-sulfonic acid, and the like.

Various negative working energy sensitive materials useful in the practice of the invention are available commercially. Thus, for example, the high molecular weight, water soluble diazo resin made from paraformaldehyde and 4-diazodiphenylamine bisulfate sold under the designations "Diazo Resin No. 4" (Fairmount Chemical Company), and "Diazo S" (American Holchst Co.) is especially suitable. In addition, the photopolymers sold under the trademarks "Redi-Cote" (Lithoplate Inc.), "Riston" disclosed in U.S. Pat. No. 3,469,982), "Lydel" and "Dycril" (E. I. Dupont de Nemours), "Letterflex" (Grace), "Photozid" (Upjohn), and others, can be used.

The positive working energy sensitive materials used in the preparation of the structure of this invention, like the negative working materials, can be selected from a wide group. Exemplary of such a material is a formaldehyde polymer of an o-quinone diazide sulfonate containing a phenol coupler. Materials of this type are disclosed, for instance, in U.S. Pat. Nos. 3,210,239 and 3,046,120. Exemplary of another positive working material which can be used in the composition comprising 2,3,4-trihydroxy-benzophenone-naphthoquinone-(1,2)-diazide-(2)-5-sulfonic acid ester and an m-cresol formaldehyde novolak resin. An o-quinone diazide product particularly suitable is sold commercially under the designation "AZ-1350" (Shipley). Other examples of such materials are photodegradable polymers exemplified by polyarylvinyl ketones and difurfurylidene pentaerythritol. The latter product is available as Warren's 1264 system (Warren). Various organometallic salts such as the tetraarylborate anions sold by Eastman Kodak can be used, as can the products sold under the designations "MICVOLINE" (GAF) and "KAR" and "EK" (Eastman Kodak).

It should be understood that while the energy sensitive materials have been described in relation to their negative working and their positive working character, certain of these materials may be made to act as either a negative working, or a positive working material, in accordance with known practices. The designation herein, therefore, of a particular energy sensitive material as being either negative working, or positive working, is merely for purposes of illustration. In addition, it should also be understood that the specific examples of energy sensitive materials set forth herein are merely representative of numerous other materials which can be utilized in the invention. Thus, for example, other materials which undergo a change in their solubility, or permeability, properties upon exposure to energy include the memory materials listed and described in copending patent application Ser. No. 143,781, filed May 17, 1971 by R. W. Hallman and S. R. Ovshinsky, entitled "Method For Producing Images And Product". In the method of said application, the memory material serves the function of the energy sensitive material and also the function of the image forming material. In accordance with the method of the present application they are used as the energy sensitive material only and in combination with a separate layer containing an image forming material.

Since, in accordance with the preferred practice of this invention, no harsh solvents such as acids are used, the energy sensitive material need not have the properties generally required in a photoresist material. The primary requirement is that the energy sensitive material change its solubility, or permeability, characteristics upon the application of energy. When a solvent is thereafter applied, the more soluble portion, if such is the case, of the energy sensitive material and the underlying portion of the image forming material are rapidly dissolved. This is an important difference in the method of the invention as opposed to the prior art photoresist methods. Because of this difference, many energy sensitive materials may be used in the structure and method of the invention which would normally not be suitable as a photoresist material in conventional photoresist work.

For ease of application, it is generally preferred that the energy sensitive material applied to the image forming film or layer be soluble in a solvent which preferably is not a solvent for the underlying image forming material. This requirement is excellently fulfilled in a situation where the energy sensitive material is soluble in an organic solvent and becomes soluble, or permeable, in an aqueous solution upon the application of imaging energy. Another important consideration is, as stated, that the energy sensitive material and the image forming material are selected such that they are mutually compatible. Diazonium salts and other light sensitive nitrogen compounds of the diazo or azido type oftentimes react with a metal, or metal-like layer, when they are deposited thereon, to become ineffective and destroyed after a short time. Tellurium, the tellurium compositions, and the other image forming materials used in the invention usually do not have this effect and the structure of the invention, therefore, has a long shelf life, maintaining its effectiveness and operativeness over long periods of time. With other image forming materials one will select from the large number of possible energy sensitive materials those which are not, or only slightly, affected by the image forming material and which do not, or only slightly, react with each other.

While, generally speaking, the energy sensitive materials do not require the addition thereto of other substances to achieve the desired change in solubility characteristics under the influence of energy, it has been found that the addition of certain substances can enhance certain properties of the energy sensitive materials. Thus, by way of illustration, it has been found that the addition of the aforementioned Diazo No. 4 resin, for example, of from about 2% to about 5%, by weight, of gelatin will enhance the durability of the Diazo No. 4 resin film or layer, and impart to it greater exposure tolerance.

As with the image forming materials, only an extremely thin film or layer of the energy sensitive material is needed. Basically, the film or layer need be only thick enough to form a coherent or continuous surface of the energy sensitive material. No excessive material is needed because the material does not serve as a photoresist requiring a harsh etching agent, for instance, fuming acids for development. Furthermore, the energy sensitive material is not needed for image formation. With most energy sensitive materials useful in the preparation of the structure of the invention, the thickness of the layer containing the material may be from about 0.1 micron to about 5 microns, especially desirably about 0.2 to about 0.6 micron.

As is readily apparent from the foregoing, structures containing the effective materials in such thin layers contain very little material and are therefore low in cost. Another advantage is that these thin layers can be dissolved or developed in extremely short times as will be set out hereinafter.

The energy sensitive materials of the invention can be applied in the form of a solution by any of various known practices, including roller coating, spraying, spinning, dipping, and the like. In the case of the aforementioned formaldehyde condensation products of diazonium salts, roller coating is an especially preferred method of application.

The substrates which can be used in the fabrication of the structure of the present invention advantageously are flexible films which desirably are transparent or translucent. Exemplary of such films are transparentized paper, cellulose acetates, glassine paper, polyethylene, polypropylene, polyethylene glycol terephthalate (Mylar), polycarbonates, polyvinyl chloride, polyamides such as nylon, polystyrene, polymethyl $\alpha$-chloroacrylate, polyacrylonitrile, and the like. For the production of visually detectable images in accordance with the practice of this invention, the desired image forming characteristic of an image forming material is opacity in the case of transmissive viewing, or reflectivity in the case of reflection viewing. For highest contrast one will select, in the case of transmissive viewing or projection, a transparent or translucent substrate such as one of the aforementioned plastic films. In the case of reflection viewing one will select a reflective substrate such as light colored paper, cardboard, plastic, or the like. By the proper choice of substrate characteristics and image forming characteristics of the image forming material, one can produce images of highest contrast and distinction. The thickness of the flexible films employed as the substrate is variable. Generally speaking, in the case of plastic films, the thickness can range from about 1 mil to 10 mils, or more. In those instances where an image is to be formed on both sides of the substrate in accordance with the double-imaging aspects of the invention, film thicknesses in the range of from about 5 mils to about 7, or 8 mils, are preferred.

The energy which may be used for imaging and for altering the solubility, or permeability, properties of the energy sensitive material may be selected in accordance with the requirement of the energy sensitive material used in each individual case. Preferred are those materials, which image upon the application of low or medium amounts of electromagnetic radiation such as UV light or infrared radiation. Some of the preferred energy sensitive materials, such as the above mentioned high molecular weight diazonium type condensation products, can be changed by very short pulses of high intensity light sources, giving off UV radiation such a mercury vapor lamps, photographic flash lamps and electronic flash lamps such as Xenon flash lamps. With these types of high energy sources, flashes of less than ¼ second, and in the case of electronic flash lamps, pulses of the order of one or two milliseconds, are sufficient to bring about the change in the solubility characteristics of the energy sensitive material. As indicated hereinabove, these extremely short exposure times are possible because opacity is achieved in the structure of this invention by means of the image forming material and not the energy sensitive material as in the case of prior duplicating microfilm materials. The imaging by the short pulses is of particular benefit in the large scale production of microform. The short pulses required for exposure coupled with the nearly instantaneous development, for instance, by wiping of the exposed material with a suitable piece of moistened felt of the like, make possible exceptionally high production rates and output in small size equipment.

As stated, a single, or common, solvent system advantageously is utilized in the development of the exposed structure of the present invention. Apart from its capabilities for rapidly dissolving, or permeating, the soluble, or permeable energy sensitive material, and for substantially simultaneously dissolving the image forming material, after exposure, the solvent, generally speaking, will be selected on the basis of the development latitude afforded by it, and whether the exposed or unexposed areas of the structure are to be acted upon by the solvent. In those instances where the unexposed areas of the structure are to be acted upon by the solvent, the solvent desirably comprises a dilute aqueous solution of an alkali metal oxidizing agent exemplified by sodium hypochlorite, lithium hypochlorite, potassium hypochlorite, and the like. Such solutions not only have a high capacity for dissolving, or permeating, unexposed portions of the energy sensitive material following exposure, but, also, have a high capacity for dissolving the image forming material especially when the latter comprises tellurium or a tellurium containing material. In this latter connection, it is surprising and unexpected that an aqueous sodium hypochlorite solvent dissolves tellurium when deposited in the form of a thin film or layer as contemplated herein. An aqueous sodium hypochlorite solution generally does not dissolve tellurium in the form of granules or small particles. On the other hand, the said solvent readily dissolves tellurium if it is deposited in the form of a thin film or layer as it is used in the present invention. The tellurium is soluble in the aqueous sodium hypochlorite solution regardless of whether it is deposited by vapor, vacuum, or by sputtering techniques. A further advantage of the aforementioned aqueous solvents resides in the fact that their solvent capacity extends over a wide range of concentrations. Thus, for example, the full strength aqueous sodium hypochlorite solution obtained as a reagent from Baker Chemicals Company and having a concentration of 6.9%, by weight, is an excellent solvent for the deposited layer of tellurium. The same reagent diluted to, for instance, 10% or even 1% of its strength is still a good solvent for the deposited thin tellurium layers. Such solvents have the added advantage of being unobnoxious, non-volatile, and of affording large development latitude in that development, for example, of the exposed structure, in the case where the energy sensitive material is a diazo compound of the type sold under the designation Diazo Resin No. 4, can take place therein at rates varying from 1 foot per minute to 100 feet per minute without adverse effect on the finished microform. Further, in this same connection, a single quart of the solution is capable of processing as much as one thousand square feet of exposed imaging material. The use of such a solution has the further important advantage of not requiring a skilled operator, or expensive and complicated processing equipment. The development latitude of aqueous solvents such as sodium hypochlorite and lithium hypochlorite can be enhanced by adding a suitable buffering agent to the solvent. Typical of such buffering agents are sodium and potassium bicarbonate.

Other oxidizing agent types of solvents having utility in the practice of the present invention include aqueous hydrogen peroxide, and aqueous solutions of potassium chlorate, and of ferric chloride. Hydrogen peroxide, like the hypochlorites, dissolves the unexposed areas of the imaging material. Potassium chlorate, by proper control of pH, can be employed to dissolve either exposed or non-exposed areas. More specifically, in this connection, at a pH of the order of 7 to 9, the exposed areas can be removed. At a higher pH in the range of about 11 to about 13, the unexposed areas can be removed. Ferric chloride acts on exposed areas only. Other solvent systems which can be used, but which, for one reason or other are not preferred, are aqueous iodine-potassium iodide solutions; iodine-potassium iodide in acetone; and iodine vapors in the presence of water vapor.

Prior patents such as U.S. Pat. Nos. 2,931,713; 3,098,043 and 3,639,185, deal with certain etchants and disclose uses thereof. The present invention is sharply distinguishable therefrom. Thus, for instance, while U.S. Pat. No. 3,639,185 is directed to the fabrication of micro-electronic semiconductor devices and utilizes photosensitive systems and etchants in two-solvent and one-solvent systems, the disclosures contained therein are of no practical value in the fields to which our invention relates such as microform and microfilm. Thus, by way of illustration, even where, in Example 10 of said U.S. Pat. No. 3,639,185, a combined etching solution is used to remove both the exposed areas of photoresist and an underlying chromium layer to provide a mask structure, the time period for said dissolving step is 12 minutes. Wholly apart from other considerations, such inordinate time periods make the procedures disclosed in said patent of no practical value in the fields to which the present invention relates.

If the substrate of the structure, consisting of or containing the image forming material is likewise soluble in the solvent used for the deposition of the energy sensitive material, the sublayer could be adversely affected when the top layer of the energy sensitive material is applied. In these instances, it is of benefit to use the structure represented in FIG. 4 of the drawings. Structure 40 comprises a substrate 42. Thereon is extended a layer 44 of an image forming material, for instance a layer of a water soluble organic polymeric material, which comprises as the image forming material, for instance, a black or dark dye such as nigrosin, or a pigment such as graphite, carbon black or other pigment. The layer 44 is of a thickness so as to provide the necessary or desired contrast in the completed image. Upon layer 44 is extended a very thin layer 46 of a protective material, such as tellurium or a tellurium containing composition, which is not soluble in water but which is soluble in an aqueous solvent medium such as the above mentioned aqueous hypochlorite solvent. The top layer 48 is formed of an energy sensitive material, for instance, by one of the aforementioned water soluble formaldehyde condensates of a diazonium compound. The layer 46 of the protective material need be only very thin, just thick enough to form a continuous, protective layer, so that the water soluble layer 44 is not affected, when the aqueous solution of the energy sensitive material is applied to form the top layer. The intermediary layer 46 may be as thin as 100 or 200 Angstroms, or so, of it may be made thicker if so desired.

Imaging and development of the structure 40 may be effected in the manner described in connection with FIGS. 1 to 3. When, for instance, development is effected with a very dilute aqueous sodium hypochlorite solution, the solution dissolves the material in layers 48, 46 and 44 in all those areas, where the material in layer 48 is water soluble or soluble in another common solvent. In other words, in this embodiment of the structure of the invention, three layers are present, which in the exposed or unexposed state are soluble in a common solvent.

As can be readily seen, in this embodiment of the structure of the invention, the intermediary layer 46 of, for instance, tellurium, does not serve as the image forming material but merely as a protective layer. If desired, the portions of the top layer 48 and of intermediary layer 46, which have not been removed in the development step, may be removed in a subsequent operation, such as by rubbing, wiping, and dissolution in a solvent which is not a solvent for the image forming material in layer 44.

The just described structure can be employed with similar benefit with any other materials being soluble in any other desired solvent and may also be used in the instance that an energy sensitive material which is insoluble in a developing solvent becomes soluble, or permeable, in response to energy applied thereto. In similar manner, the structures of the invention may be provided with four or more layers which in one state or the other are soluble in a common solvent.

As indicated, the structures of the invention may also be used for reflection copying. In this case, one will use a light transmissive substrate and make the film or layer of the image forming material from a material which is in the thickness employed, at least in part light transmissive, and which has a low reflectance. A suitable image forming material for this type of structure is, for instance, tellurium, or a tellurium containing composition, in a thickness of, for instance, about 200 Angstroms. The energy sensitive material may be one of the above mentioned high molecular weight diazonium condensation products, and the substrate may be, for instance, Mylar or cellulose acetate. Other structures of the invention comprising other image forming materials and other energy sensitive materials may be used with equal benefit in the reflection copying method. Preferred are energy sensitive materials which are sensitive to electromagnetic radiation and preferably to visible light.

As stated above, the method and structures of the invention are of particularly important value in the production of microform, such as microfilm and microfiche. The method is not only extremely rapid, allowing a high output and production rate as described above, but, also, enabling the production of microform of the highest quality. The materials of the invention provide images of highest resolution equalling or exceeding the best commercially available materials. Definition is excellent and, in view of the extremely high gamma, usually about 2 to about 6, excellent contrast is achieved. Since in the present invention image forming materials of the highest possible opacity can be selected independently of their light sensitivity, the images made with the preferred materials of the invention have the highest contrast of all commercially used imaging materials.

The high gamma of the materials of the invention makes possible the obtention of very high contrast images which may, as stated above, be even sharper than the image in the master from which it is taken. This is demonstrated by the representation in FIGS. 5 to 7 of the drawings. FIG. 5 represents in great magnification a thin line or character 50, as it may be represented, for instance, in a silver halide mask. The central area 52 has the highest density obtainable in the silver halide image. The areas 54 at both edges represent a gray area, falling off in density from the black to the transparency of the background. This fall-off of density is represented in FIG. 5 by the triangular sections 56. This means the deepest gray is at edge 58 of the black area 52 and zero density or complete transparency begins at lines 60.

Figure 6:
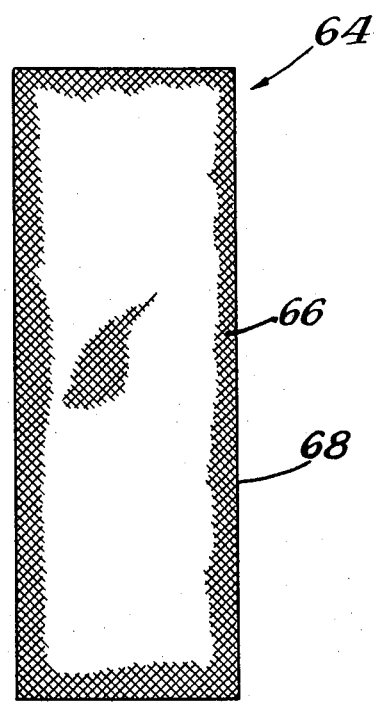

A copy 64 of the character 50, made on an imaging structure of the invention, is represented in FIG. 6. The copy 64 of the character is represented by a highly opaque area 66 bordered by sharp lines and lacking the gray edge areas which were present in the original. In other words, there is a sharp step from the highly opaque area 66 to the fully light transmissive area beyond border lines 68. The absence of the gray, fuzzy edges 54 makes for a sharper image. It is to be noted that the highly opaque area 66 is somewhat wider than area 52 in the original, yet not as wide as the character 50 at the outer lines 60. This makes for greater sharpness and for higher resolution, so that in fact, the use of the imaging materials permits increase in the resolution of the copy over that of the original. As is well known, normally with most copying material, the resolution and the sharpness in a copy will be lower than in the original.

Figure 7:
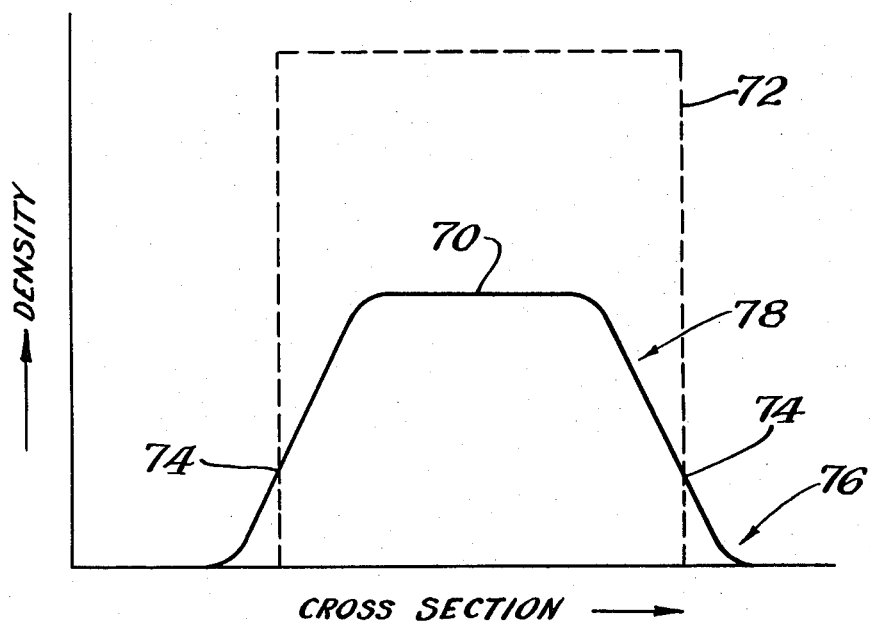
FIG. 7 is a representation showing the situation of FIGS. 5 and 6 graphically.

The foregoing situation is graphically represented in FIG. 7. Density is plotted on the ordinate against the cross-section in the absence of a character such as represented in FIG. 5. Curve 70 shows that density increases as one moves from the edge of the character toward the center until it has reached its maximum value. Toward the opposite edge, the density thereafter starts falling off until it reads zero. Any density of the background has been subtracted and is not represented in curve 70. Curve 72 (broken lines) represents the curve taken in similar manner from the copy of the character used for curve 70, and made on a copying material in accordance with the invention as described hereinbefore. It can be seen from curve 72 that, as one approaches the character, the density goes right up to its highest value, stays there across the character and drops to zero at the other edge. It is also to be noted that the density in the copy of the character, represented by curve 72, is considerably greater than the maximum density achieved in the original. Points 74 at the crossing between curves 70 and 72 are the trigger point. They can be selected by varying the exposure time in making the copy to fall further out, e.g. at the point indicated by the arrow at 76, or to fall further in, indicated by the arrow at 78. The method and structures of the invention permit, therefore, not only removal of the gray or fuzzy areas present in the original but, by selecting the trigger point, permit a wide choice of acuity and definition, making it possible to adjust the resolution to the requirements of any particular situation. As is readily apparent, this makes the imaging materials of the invention far superior materials for producing microform of highest quality.

Figure 8:
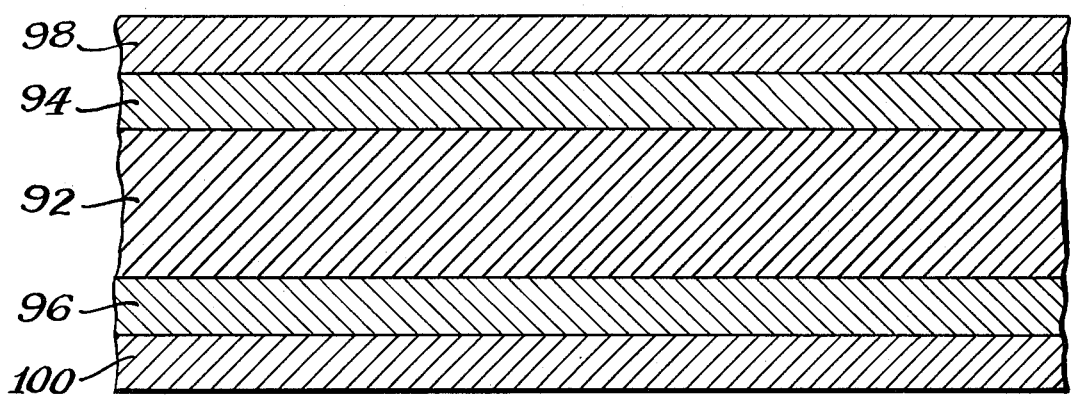
FIG. 8 is a schematic fragmentary representation of yet another embodiment of the structure of this invention showing imaging material on both sides thereof.
Figure 9:
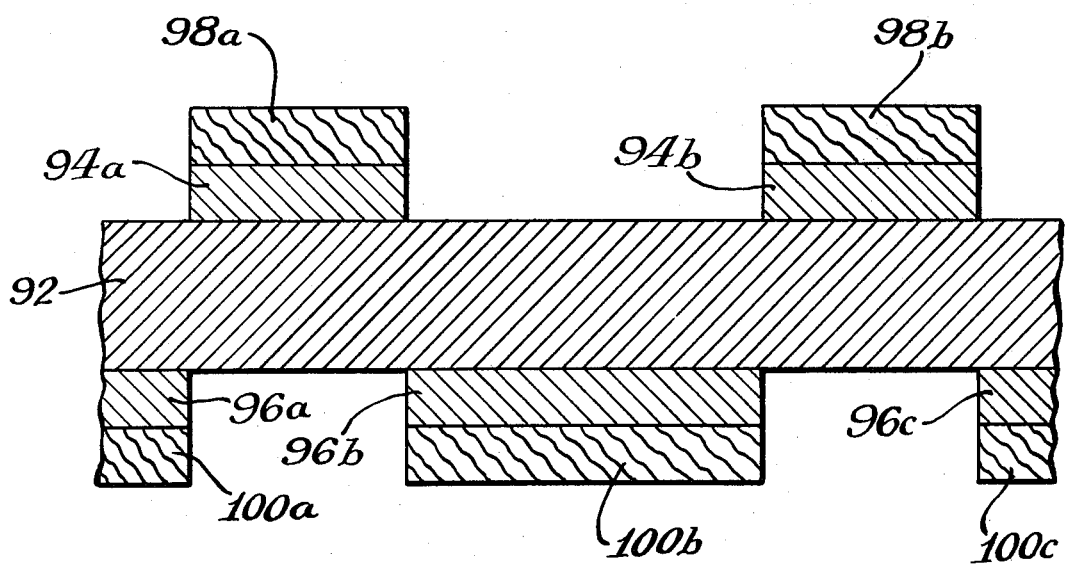
FIG. 9 is a representation of the embodiment of FIG. 8 showing the structure after exposure and development in accordance with the practice of this invention.

In FIG. 8 of the drawing, an embodiment of the structure is shown which is capable of having images produced on both sides thereof. The structure, designated generally by reference numeral 90, comprises a flexible substrate 92 having a layer or film of an image forming material 94 on one side thereof, and a layer of film of an image forming material on the other side thereof. The layer or films of the image forming material 94 and 96, in turn, are provided with a layer or film of an energy sensitive material 98 and 100, respectively. When each side of the structure 90 is exposed to energy in a manner similar to that shown in FIG. 1, and the unexposed areas, for example, are removed as described herein, the structure 90 will have an image on both sides thereof, the image on one side being defined by insoluble, or impermeable, areas 98a and 98b of energy sensitive material 98, and undissolved, underlying areas 94a and 94b of image forming material 94, and the image on the other side being defined by insoluble, or impermeable, areas 100a, 100b and 100c of energy sensitive material 100, and undissolved, underlying areas 96a, 96b and 96c of image forming material 96. The images on each side of the structure advantageously are staggered with relation to one another as shown in FIG. 9. As indicated hereinabove, in those instances where the energy sensitive material is changed to a state of impermeability by exposure to energy, the impermeable areas, being transparent, do not adversely affect the images formed on each side of the structure 90. By employing a substrate having a sufficient thickness, and by suitable focal length adjustment of a magnifying readout lens, the image on one side of the structure can be read without interference from the image on the other side of the structure. The images on each side of the structure, thus, may be read alternately without the need for turning the structure over. An added feature of the double-sided imaged film of this invention is that it is very difficult to reproduce onto any duplicating film with existing contact duplication equipment. This has important advantages in those instances where the imaged subject matter is classified or secret, for example.

The following examples are illustrative of specific embodiments of the invention.

EXAMPLE 1

A solution containing 8 weight percent Diazo Resin No. 4 is roller coated onto a substrate having a vacuum deposited film of tellurium, 1200 Angstroms thick, on one side thereof. The resin layer is 0.2 micron thick. The structure is exposed through a silver halide microform master for 1 second using a Microscan A-9 exposure unit. The exposed structure is immersed in a beaker containing 25 volume % NaOCl and 0.5 weight % sodium bicarbonate in water. Those areas of the Diazo Resin No. 4 layer which are not exposed, and the areas of the tellurium film underlying the unexposed areas of the resin layer, are simultaneously etched in about 1 second. The structure is allowed to remain in the etchant for approximately 60 seconds. The exposed areas are unaffected. After rinsing and drying a high quality reverse polarity duplicate is obtained.

EXAMPLE 2

The structure of Example 1 is exposed as described in the example. The structure is then immersed in a solution comprising 5 weight % $NaClO_3$ and 2 weight % citric acid in water. The unexposed areas of the resin, including the underlying tellurium areas, are simultaneously dissolved in less than 3 seconds. Exposed areas of the structure remain unchanged after immersion in the solution for more than one minute. The imaged structure is rinsed and dried to provide a high quality reverse polarity duplicate.

EXAMPLE 3

A structure is prepared as in Example 1 and is exposed for less than 1/100 second using a vacuum frame and a 50 joule Norman flash lamp. A silver halide microform master is used for imaging. The structure is immersed in an aqueous solution comprising 3 volume % $H_2O_2$ and 0.25 weight % sodium bicarbonate. The unexposed areas of the resin, including the underlying tellurium areas, are simultaneously dissolved in less than 1 second. A high quality reversal image is obtained.

EXAMPLE 4

A 1200 Angstrom thick film of tellurium is vacuum deposited on one side of a Mylar substrate. A 0.3 micron thick layer of Shipley's 1350 series positive resist is applied on the tellurium film by dip coating. After drying, the structure is exposed through a silver halide master on a Microscan A-9 exposure unit for 15 seconds. The exposed structure is contacted with a solution comprising 25 volume % NaOCl and 0.3 weight % NaOH in water. The exposed areas of the resist layer, and the underlying areas of the tellurium film, are simultaneously dissolved in 5 seconds. The structure is rinsed with water and dried. A high quality, non-reversed image is obtained.

The imaged structure is stored for two weeks under conditions to protect it against exposure to ultraviolet radiation. Unexposed areas of the imaged structure are exposed, and the exposed areas dissolved as before. The structure is rinsed with water and dried. A high quality, non-reversed image is obtained consisting of the prior and the added image.

EXAMPLE 5

The structure of Example 4 is processed as described therein except that the etchant comprises 100 grams of LiOCl and 38 grams of NaOH in 1.5 liters of water. The pH of the solution is 13. A high quality, non-reversed duplicate is obtained.

EXAMPLE 6

A solution comprising 5 weight % of the reaction product of maleic anhydride copolymer with a hydroxy terminated arenosulfono azide (Photozid) in pyridine and 2 volume % Michler's ketone is applied by dip coating onto a 1200 Angstroms thick film of tellurium on Mylar. The solvent is evaporated to provide a 0.3 micron thick layer of the reaction product on the tellurium film. The structure is exposed for 30 seconds on a Microscan A-9 exposure unit using a silver halide master. Using a solution comprising 50% water and 50% methanol in which 2% by weight NaClO$_3$ and 1% by weight citric acid are dissolved, the unexposed areas of Photozid, and the underlying areas of the tellurium film, are simultaneously dissolved in 5 seconds. The structure is then rinsed with water and dried. A high quality reversed polarity duplicate is obtained.

EXAMPLE 7

A solution containing 8 weight % Diazo Resin No. 4 is roller coated onto a Mylar substrate having a vacuum deposited 1500 Angstroms thick film of molybdenum on one side thereof. The resin film is 0.2 micron thick. Using a silver halide microform master, the structure is exposed for 3 seconds on a Microscan A-9 exposure unit. The unexposed areas of the resin, and the underlying areas of the molydenum film, are simultaneously dissolved in 3 seconds in a solution comprising 10 volume % Na OCl and 1% by weight of sodium bicarbonate in water. The structure is rinsed and dried to provide a reverse polarity duplicate.

EXAMPLE 8

A structure comprising a 0.3 micron thick layer of Shipley's 1350 series positive photoresist and a 1500 Angstroms thick film of aluminum on polyethylene is processed as in Example 4. A non-reversed image is obtained.

EXAMPLE 9

A structure comprising a 0.2 micron thick layer of Diazo Resin No. 4 and a 1000 Angstroms thick film of germanium on Mylar is processed as in Example 1. A reverse polarity duplicate is obtained.

EXAMPLE 10

Onto both sides of a 7 mils thick Mylar substrate, a 1200 Angstroms thick film of tellurium is applied by sputtering. A solution comprising 8 weight % Diazo Resin No. 4 is roller coated onto the tellurium film on each side of the substrate. The thickness of each resin layer is 0.3 micron. One side of the resulting structure is then exposed through a silver halide microform master for 1 second on a Microscan A-9 exposure unit. The structure is turned over, and the other side is exposed through a different master for 1 second on the same unit. The exposed structure is immersed in a solution comprising 25 volume % NaOCl and 0.5 weight % NaOH. The unexposed areas on each side of the structure are simultaneously dissolved in 2 seconds. The structure is rinsed with water and dried. A high quality reversal image is obtained on each side of the structure. When viewed through a properly focused lens, at 100X, first one side, and then the other side, of the structure can be viewed without turning the structure over.

While the present invention has been described with relation to its utility in the production of microform, microfilm, in particular, it should be understood that the invention has applicability in other fields. Thus, for example, the high gamma and high contrast obtainable with the structure, coupled with its inherent dimensional stability and its ability to be processed easily and rapidly, make the structure highly suited to the production of litho films, wash-off films, reticles and mask. In addition, in those instances where the substrate used has a complementary hydrophilic or hydrophobic affinity as compared to the images produced, the structure is useful for making lithographic printing plates. More specifically in this connection, grained and silicated aluminum onto which is deposited a film of tellurium, for example, followed by a layer of an energy sensitive material such as Diazo Resin No. 4 or an o-quinone azide, as disclosed herein, when exposed and developed in accordance with the teachings of this invention, results in a lithographic plate. The images obtained are highly editable, and do not require further lacquering before printing. Other fields of use of the invention, of course, will occur to those skilled in the art. It should be understood, therefore, that the invention may be practiced other than as specifically described and illustrated herein without departing from the spirit and scope of the invention.

What is claimed is:

1. A structure for producing images comprising a substrate, a thin film of a metallic or metallic-like image forming material comprising tellurium or a tellurium containing composition on a surface of the substrate, said image forming material being characterized in that it is opaque and is easily soluble in a solvent consisting essentially of a dilute aqueous solution of an alkali metal hypochlorite, and a thin film of an energy sensitive material on the film of image forming material, said energy sensitive material being characterized in that it is capable upon the application of energy of changing between two states, one of which is a state in which the energy sensitive material is substantially soluble or permeable with respect to the aforementioned solvent in which the image forming material is easily soluble and the other being a state in which the energy sensitive material is substantially insoluble or impermeable with respect to said solvent, the film of energy sensitive material and the film of image forming material and the thinnesses thereof being such that the change in the state of the energy sensitive material upon the application of energy thereto and the essentially simultaneous dissolution in said solvent of both the energy sensitive material in those areas where it is in a substantially soluble or permeable state and the image forming material underlying said areas, can together, take place in substantially less than one minute to provide an imaged product.

2. A structure for producing images consisting essentially of, a thin, flexible substrate, a thin film on the substrate of a metallic or metallic-like image forming material selected from the group consisting of tellurium and a tellurium-containing composition wherein tellurium comprises at least about 50%, by weight, of the composition, said image forming material being characterized in that it is opaque and is readily soluble in an aqueous solution of an alkali metal hypochlorite, and a thin film of an energy sensitive material on the film of image forming material, said energy sensitive material being characterized in that upon the application of energy to selected areas thereof, the energy exposed areas of the energy sensitive material are changed to a state wherein they are readily soluble in said aqueous solution of an alkali metal hypochlorite, the film of energy sensitive material and the film of image forming material and the thinnesses thereof being such that the change in the solubility of the energy exposed areas thereof and the dissolution of said areas and the image forming material underlying said areas by an aqueous solution of an alkali metal hypochlorite takes place substantially simultaneously in less than one minute to provide an imaged product.

3. A structure according to claim 1 wherein the energy sensitive material is an o-quinone diazide.

* * * * *

UNITED STATES PATENT AND TRADEMARK OFFICE
CERTIFICATE OF CORRECTION

PATENT NO. : 4,379,827
DATED : April 12, 1983
INVENTOR(S) : Robert W. Hallman

It is certified that error appears in the above-identified patent and that said Letters Patent is hereby corrected as shown below:

Column 3, line 28, change "were" to --where--.
Column 3, line 56, change "substractive" to --subtractive--.
Column 4, line 66, change "is" to --are--.
Column 8, lines 52 and 53, change "difficulty" to --difficultly--.
Column 10, line 67, change "MICVOLINE" to --MICROLINE--.
Column 13, line 14, change "a" to --as--.
Column 13, line 31, change "of" to --or--.
Column 15, line 24, change "of" to --or--.
Column 19, line 24, change "molydenum" to --molybdenum--.

Signed and Sealed this

Thirtieth Day of April 1985

[SEAL]

Attest:

DONALD J. QUIGG

Attesting Officer     Acting Commissioner of Patents and Trademarks